United States Patent [19]

Usami

[11] Patent Number: 6,099,747
[45] Date of Patent: Aug. 8, 2000

[54] CHAMBER ETCHING OF PLASMA PROCESSING APPARATUS

[75] Inventor: Tatsuya Usami, Tokyo, Japan

[73] Assignee: NEC Corporation, Tokyo, Japan

[21] Appl. No.: 09/166,424

[22] Filed: Oct. 5, 1998

Related U.S. Application Data

[62] Division of application No. 08/763,104, Dec. 10, 1996.

[30] Foreign Application Priority Data

Dec. 15, 1995 [JP] Japan ..................... 7-327701

[51] Int. Cl.$^7$ ...................................... B05D 3/14
[52] U.S. Cl. .......................... 216/37; 118/625; 134/1.1; 134/22.1; 156/345; 427/569; 438/905
[58] Field of Search .................. 156/345; 427/533, 427/534, 535, 553, 562, 569, 595; 134/1.1; 117/92, 93; 438/666, 714, 729, 905; 118/704, 723, 620, 625; 216/37, 67, 71

[56] References Cited

U.S. PATENT DOCUMENTS 4,960,488 10/1990 Law et al. ............................ 438/694
5,449,411 9/1995 Fukuda et al. .
5,520,142 5/1996 Ikeda et al. .
5,531,862 7/1996 Otsubo et al. .
5,585,012 12/1996 Wu et al. .
5,660,671 8/1997 Harada et al. .
5,688,330 11/1997 Ohmi .
5,705,019 1/1998 Yamada et al. .

FOREIGN PATENT DOCUMENTS 0 464 696  1/1992  European Pat. Off. .
2-70066    3/1990  Japan .

*Primary Examiner*—Randy Gulakowski
*Assistant Examiner*—Allan Olsen
*Attorney, Agent, or Firm*—Young & Thompson

[57] ABSTRACT

A plasma processing apparatus and method in which a counter electrode is connected to a high frequency power source to generate a plasma and the substrate electrode is grounded and in which the substrate electrode is connected to a high frequency power source and the counter electrode is grounded to perform chamber etching.

8 Claims, 5 Drawing Sheets

CHAMBER ETCHING OF PLASMA PROCESSING APPARATUS

CROSS-REFERENCE TO RELATED APPLICATIONS

This application is a division of copending application Ser. No. 08/763,104, filed Dec. 10, 1996.

BACKGROUND OF THE INVENTION

This invention relates to a plasma processing apparatus and, in particular, to plasma etching cleaning or chamber etching of such a plasma processing apparatus.

For forming a thin film in production of semiconductor devices, the CVD (Chemical Vapour Deposition) is known in the prior art. Further, in order to deal with higher integration such as a ultra LSI (Large Scaled Integration), the plasma CVD has been used for formation of a reliable thin insulating film or layer, such as a silicon dioxide layer of high quality. The plasma CVD processing is performed by use of a plasma processing apparatus.

The plasma processing apparatus comprises a substrate electrode and a counter electrode facing the substrate electrode with a predetermined space therebetween within a chamber. A wafer is disposed and supported on a surface of the substrate electrode. The substrate electrode is provided with an insulating cover which covers a circumferential peripheral portion of the substrate electrode. A reaction gas of a silane is introduced into the chamber, and a high frequency power is applied to the counter electrode while the substrate electrode is grounded. Thus, a glow discharge is caused between the both electrodes and generates a plasma of the reaction gas which is highly excited. Therefore, a silicon dioxide film is efficiently deposited onto the wafer but simultaneously, the reaction product adheres, as an undesired silicon layer, onto the peripheral components of electrodes, especially, the insulating cover of the substrate electrode.

After the plasma CVD apparatus is repeatedly used for forming the silicon oxide film on different wafers, the reaction product adhering accumulates to form an undesired silicon dioxide layer of an excessive thickness so that the undesired silicon oxide film peels off to obstruct the plasma discharge.

Therefore, after the plasma processing apparatus has been used for formation of the silicon oxide layer on a predetermined number of wafers, the plasma processing apparatus is subjected to a plasma etching or chamber etching to clean components within the chamber, especially, the substrate electrode and the insulating cover of the substrate electrode.

The chamber etching is performed by introducing, in place of the silane reaction gas, fluorocarbon gas into the chamber and performing the plasma processing. The fluorocarbon, for example, $CF_4$ reacts with the silicon dioxide to form $SiF_4$ and $CO_2$ which are discharged out of the chamber through a gas outlet. Thus, the undesired silicon dioxide is removed.

However, the plasma processing apparatus has suffered from silicone dioxide particles peeling off the insulating cover of the substrate electrode after repeated plasma CVD processings. Here, the insulating cover is usually made of alumina ($Al_2O_3$).

In order to resolve the problem of particles caused after repeated CVD processing, JP-A-2 70066 proposes the use of silicon carbide (SiC) for the insulating cover. According to JP-A-2 70066, the $Al_2O_3$ insulating cover reacts with $CF_4$ to form $AlF_3$ which deposit onto the insulating cover during the chamber etching. Thereafter, plasma deposition is repeated and silicon dioxide layer are increased in thickness, it peels off to generate undesired particles, because $AlF_3$ has little surface energy. On the other hand, SiC reacts with $CF_4$ to form $SiF_4$ and $CO_2$ which are discharged out of the chamber through a gas outlet.

According to JP-A-2 70066, the substrate electrode is grounded during both the plasma CVD processing and the chamber etching. Therefore, the undesired silicon oxide is deposited on the insulating cover by a large amount as compared with the counter electrode during the CVD processing, but the undesired silicon oxide on the insulating cover is not easily etched as compared with that on the counter electrode during the chamber etching. Therefore, there still remains the problem of consuming much time in etching the undesired silicon oxide on the insulating cover.

In order to improve the etching rate of the chamber etching and to decrease the frequency of maintenance operation of the plasma processing apparatus, it is necessary to improve the ratio of the etching selectivity of the silicon oxide film formed during the plasma CVD processing to that of SiC.

SUMMARY OF THE INVENTION

For the solution of the problems mentioned above, it is an object of this invention to provide a method for cleaning a plasma processing apparatus by chamber etching with a reduced cleaning time but without possibility of deterioration of the insulating cover due to over-etching and without generating particles.

This invention provides a chamber etching method of a plasma processing apparatus. The apparatus comprises a substrate electrode for supporting a sample wafer thereon, an insulator cover of silicon carbide disposed to cover a circumferential peripheral portion of the substrate electrode, and a counter electrode facing the substrate electrode within a chamber, a silicon dioxide layer being formed on the wafer by a CVD processing by using a plasma reaction gas within the chamber, the silicon dioxide layer being also formed, as undesired silicon dioxide layer, on surfaces of components within the chamber including the insulator cover and the electrodes. The method is for removing the undesired silicon dioxide layer on surfaces of the components and comprises: connecting the substrate electrode to a high frequency power source and grounding the counter electrode; introducing a fluorocarbon gas into the chamber; and supplying a high frequency power to the substrate electrode from the high frequency power source so as to perform the chamber etching to thereby remove the undesired silicon dioxide layer.

According to an aspect of this invention, a plasma processing apparatus is obtained for use in formation of a silicon dioxide layer on a wafer by the plasma CVD processing and adaptable for performing the chamber etching. The apparatus comprises: a chamber having a gas inlet for introducing gas and a gas outlet for discharging exhausted gas, the gas inlet introducing a reaction gas for forming the silicon dioxide during the plasma CVD processing while the gas inlet introducing a fluorocarbon gas during the chamber etching; a substrate electrode fixedly disposed within the chamber having a substrate electrode terminal exposed outside the chamber, the wafer being disposed and supported on a central surface portion of the substrate electrode during the plasma CVD processing; an insulating cover of silicon carbide fixedly disposed on a circumferential peripheral portion of the substrate electrode; a counter electrode facing the substrate electrode with a predetermined gap therebetween and having a counter electrode terminal exposed outside the chamber; a power source supplying a high frequency electric energy; and a power source switching means for connecting one of the substrate electrode terminal and the counter electrode terminal to the power source and grounding the remaining electrode terminal, whereby the power source supplies the high frequency electric energy to the counter electrode during the plasma CVD processing, while the power source supplies the high frequency electric energy to the substrate electrode during the chamber etching.

According to another aspect of this invention, a plasma processing apparatus is obtained for use in formation of a silicon dioxide layer on a wafer by the plasma CVD processing and adaptable for performing the chamber etching method. The apparatus comprises: a chamber having a gas inlet for introducing gas and a gas outlet for discharging exhausted gas, the gas inlet introducing a reaction gas for forming the silicon dioxide during the plasma CVD processing while the gas inlet introducing a fluorocarbon gas during the chamber etching; a substrate electrode fixedly disposed within the chamber having a substrate electrode terminal exposed outside the chamber, the wafer being disposed and supported on a central surface portion of the substrate electrode during the plasma CVD processing; an insulating cover of silicon carbide fixedly disposed on a circumferential peripheral portion of the substrate electrode; a counter electrode facing the substrate electrode with a predetermined gap therebetween and having a counter electrode terminal exposed outside the chamber; a first power source for supplying a first high frequency electric energy; a second power source for supplying a second high frequency electric energy; a first power source switching means for connecting the substrate electrode terminal to the ground as to ground as the substrate electrode during the plasma CVD processing while connecting the first power source to the substrate electrode terminal during the chamber etching; and a second power source switching means for connecting the second power source to the counter electrode during the plasma CVD processing, while connecting the counter electrode terminal to the ground to ground the counter terminal during the chamber etching.

In the apparatus, the counter electrode may have a peripheral portion thereof formed of silicon carbide.

The apparatus may be an electron cyclotron resonance type having the counter electrode of a horn type.

The apparatus may be a parallel electrode type wherein the substrate electrode and the counter electrode are flat electrodes disposed in parallel with each other.

DESCRIPTION OF PREFERRED EMBODIMENTS

Prior to description of embodiments of this invention, description will be made as regards a plasma processing apparatus disclosed in JP-A-2 70066 with reference to FIG. 1.

Figure 1:
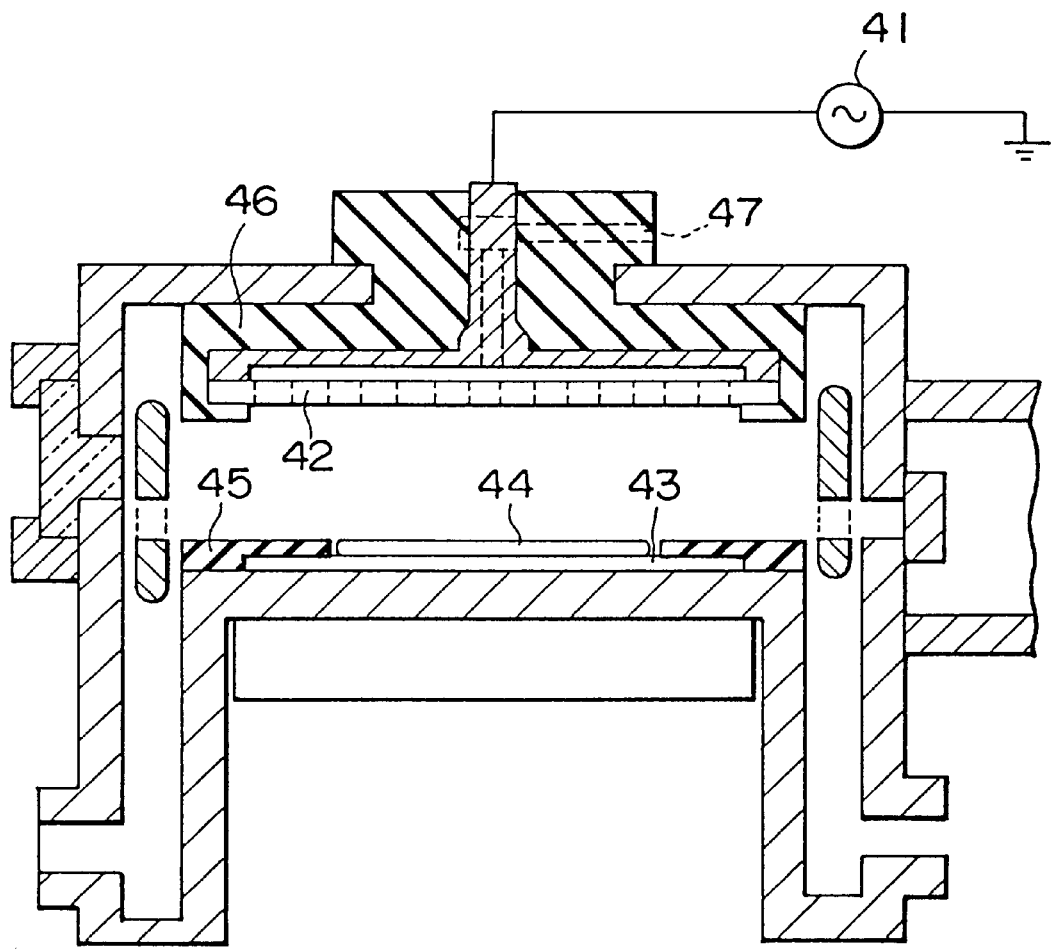
FIG. 1 is a schematic cross sectional view illustrating a conventional plasma processing apparatus.

Referring to FIG. 1, a shower electrode (counter electrode) 42 is connected to an RF power source 41 and a susceptor (substrate side electrode) 43 is grounded. A wafer 44 is mounted on the susceptor 43 and the peripheral part of the susceptor 43 is covered with an insulating cover 45 made of SiC. An insulating ring 46 is, if it is necessary, made of SiC. In the insulating ring 46, a gas inlet 47 is formed for introducing a reaction gas into a chamber of the apparatus. The plasma processing apparatus uses SiC for the insulating cover and thereby prevents the silicon oxide layer deposited on the insulating cover from easily peeling off even after the plasma CVD is performed for a number of wafers. However, the use of SiC for the insulating cover of the substrate electrode is still disadvantageous as described in the above.

A plasma processing apparatus according to the first embodiment of this invention will be described with reference to FIG. 2.

Figure 2:
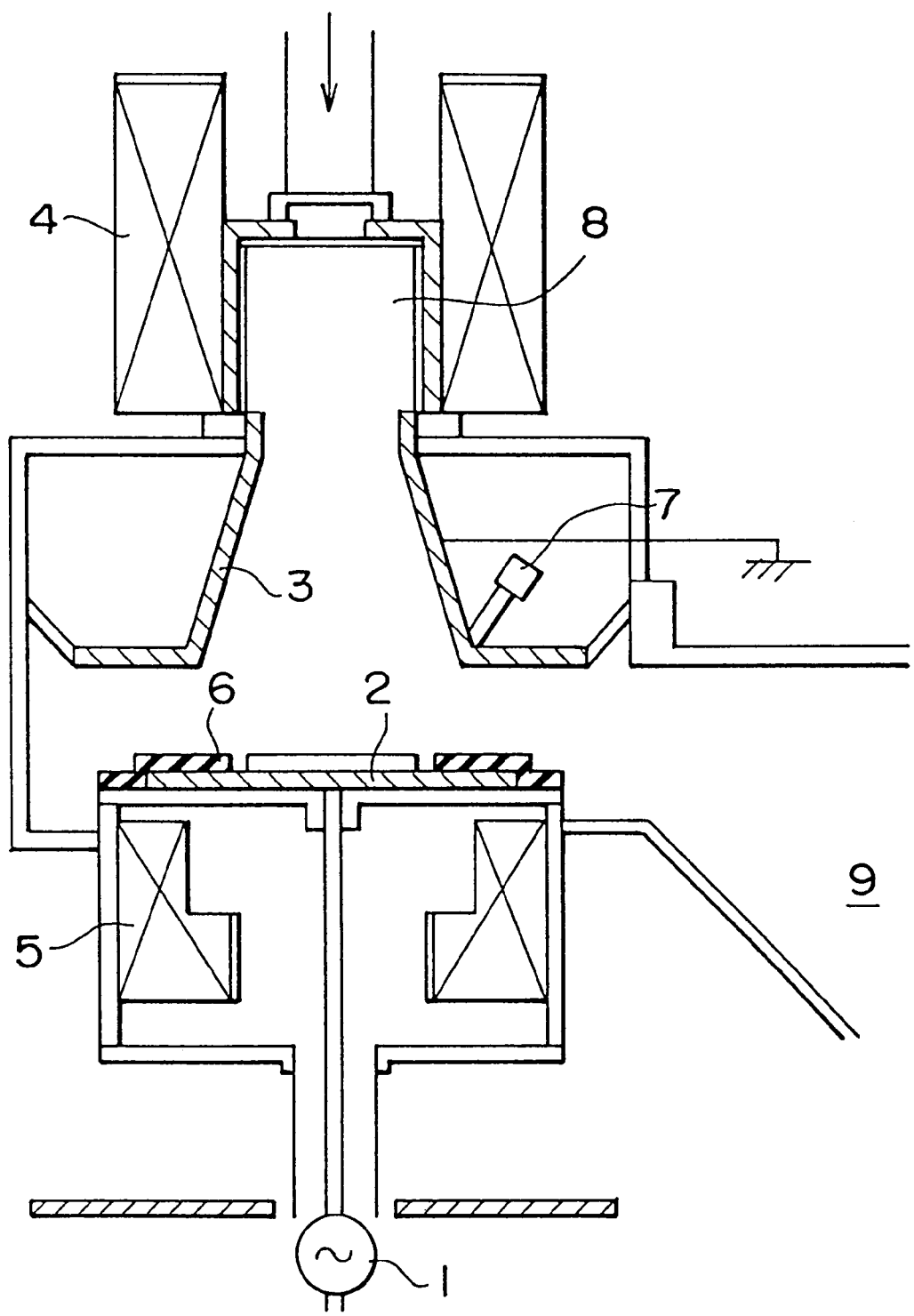
FIG. 2 is a schematic cross sectional view illustrating a plasma processing apparatus according to a first embodiment of this invention.

Referring to FIG. 2, the plasma processing apparatus shown therein is an ECR (Electron Cyclotron Resonance) type.

The ECR type plasma processing apparatus comprises a power source 1, a susceptor 2, an insulating cover 6 made of SiC and adapted to cover a circumferential periphery of the substrate electrode 2, and a horn (counter electrode) 3. The substrate electrode 2, the horn 3, and the insulating cover 6 are disposed within a plasma chamber 8. A first magnet 4 and a second magnet 5 are arranged outside of the chamber 8 for controlling a magnetic field. A gas inlet 7 is provided for introducing a gas into the chamber 8, and an exhausted gas outlet 9 is also provided for discharging the exhausted gas outside the chamber 8.

After forming a silicon dioxide ($SiO_2$) on wafer by use of the plasma processing apparatus with the horn 3 being connected to the power source 1 and the substrate electrode grounded, the chamber etching was performed to clean the apparatus without any wafer loaded.

In the chamber etching, a gas was introduced into the chamber 8 through the gas inlet 7, and a microwave of, for example, 2.45 GHz was introduced into the chamber 8 from a recess thereof under a microwave power of 2.0 kw, and a bias of 13.56 MHz at 1.5 kw was applied across the horn 3 and the substrate electrode 2 to perform the chamber etching.

The chamber etching was tried for different conditions.

Here, the etching rates of the $SiO_2$ film on the insulating cover 6 was measured for two cases. In one case, the substrate electrode 2 was connected to the power source 1 through its terminal exposed outside the chamber 8 and horn 3 was grounded through its terminal exposed outside the chamber 8, as shown in FIG. 2. In the other case, the horn 3 was connected to the power source 1 and the substrate electrode 2 was grounded. The measured result is shown in FIG. 4.

Figure 4:
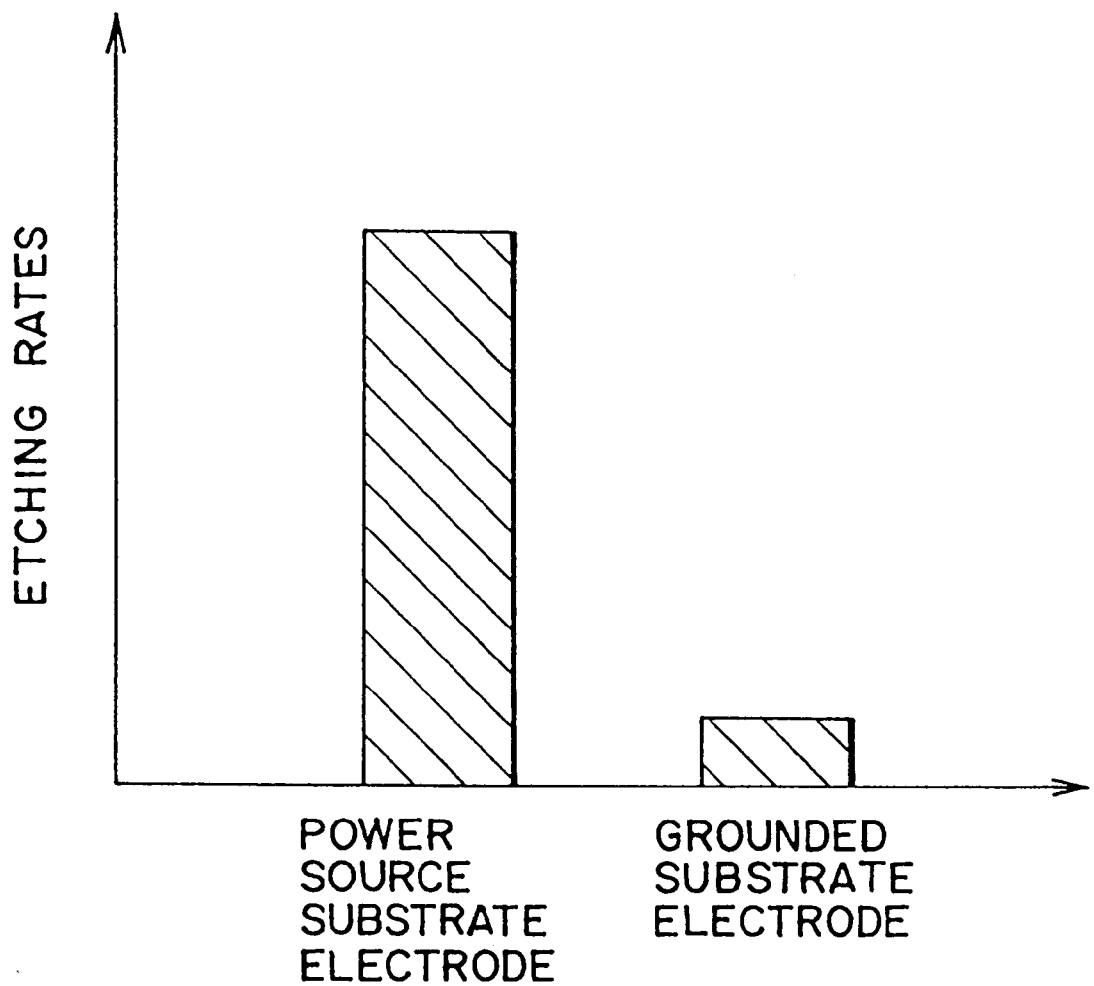
FIG. 4 is a view illustrating an etching rate of $SiO_2$ on an insulating cover when a substrate electrode is connected to a power source during the chamber etching in comparison with that when the substrate electrode is grounded.

It is noted from FIG. 4 that the $SiO_2$ film on the insulating cover 6 is etched and removed when the substrate electrode 2 was connected to the power source 1 to be used as a power source substrate electrode, but it was not almost removed when the substrate electrode was connected to the ground to be used as a grounded substrate electrode.

Then, using the substrate electrode 2 as the power source substrate electrode, the chamber etching was performed for three different gases introduced at a rate of about 100 sccm (standard cubic centimeters per minute), that is, $CF_4$, $SF_6$, and $NF_3$. In use of each gas, the etching selectivity ratio of $SiO_2$ to SiC of the insulating cover 6 was measured. The result is shown in FIG. 5.

Figure 5:
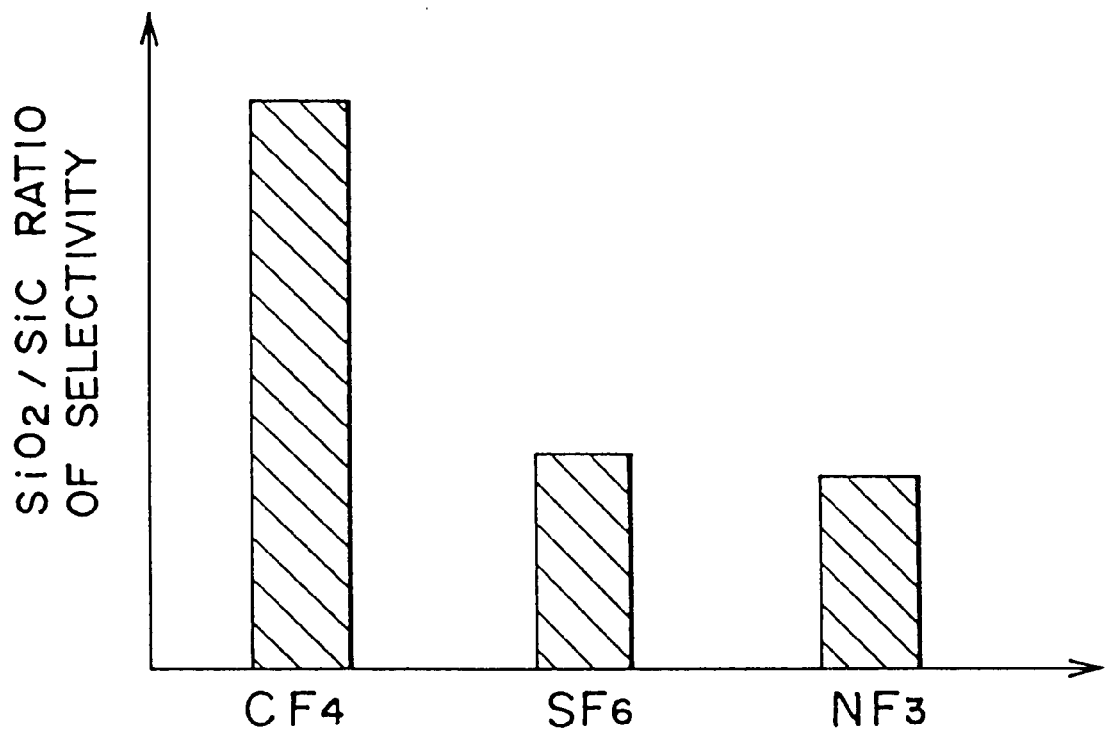
FIG. 5 is a view illustrating ratios of the etching selectivity for a $SiO_2$ film and SiC during the chamber etching using different gases, $CF_4$ gas, $SF_6$ gas, and $NF_3$ gas.

It is clearly noted from FIG. 5 that the etching selectivity ratio is higher when the etching was performed with $CF_4$ and the ratio is low when the etching was performed with $SF_4$ or $NF_3$.

When the fluorocarbon type gas is used in the operation of etching, $SiO_2$ reacts with the fluorine of the fluorocarbon to emits $SiF_4$ which is in a gaseous state at room temperature, and also reacts with the carbon thereof to emit $CO_2$. Thus, $SiO_2$ is efficiently removed.

Meanwhile, SiC reacts with the fluorine of the fluorocarbon to emit $SiF_4$ but does not react with carbon of the fluorocarbon because of the presence of C in the SiC. The etching of the SiC, therefore, does not proceed appreciably. As a result, the peripheral portion made of SiC of the substrate electrode is not deteriorated even by over-etching, so that the plasma processing apparatus is insured to be used with a low particle generation.

In the first embodiment of this invention, the peripheral part of the horn (counter electrode) may be, if necessary, formed of SiC.

The first embodiment of this invention has been described in conjunction with an ECR type plasma processing apparatus. This invention is also applicable to a plasma processing apparatus of a parallel electrode type in which the substrate electrode and the counter electrode are flat and disposed in parallel with each other.

Next, a second embodiment of this invention will be described below with reference to FIG. 3.

Figure 3:
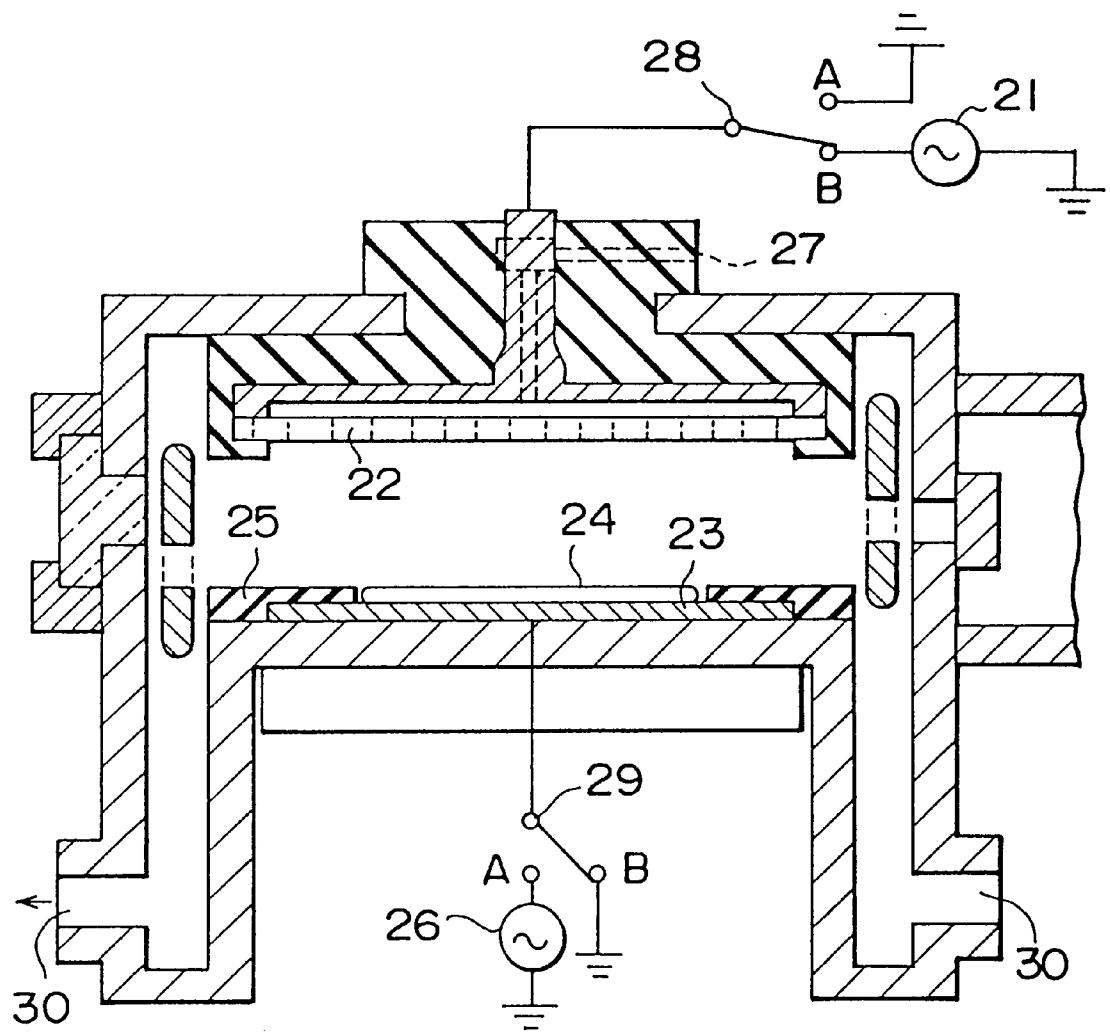
FIG. 3 is a schematic cross sectional view illustrating a plasma processing apparatus according to a second embodiment of this invention.

Referring to FIG. 3, the plasma processing apparatus shown therein is the parallel electrode type. This plasma processing apparatus is further characterized by provision of a function of switching a power source electrode and a grounded electrode.

This plasma processing apparatus comprises a first RF power source 21, a shower electrode (counter electrode) 22, a first changeover switch 28 for connecting the shower electrode 22 to either the first RF power source 21 or the ground, a susceptor (substrate electrode) 23 for supporting a wafer 24, an insulating cover 25 formed of SiC and disposed in the proximity of the susceptor 23, a second RF power source 26, a second changeover switch 29 for connecting the susceptor 23 to either the second RF power source 26 or the ground, a gas inlet 27 for introducing a gas into the chamber, and a gas outlet 30 for discharging an exhausted gas outside the chamber.

To form the silicon dioxide film onto the wafer 24 by use of the plasma processing apparatus according to the second embodiment, the susceptor (substrate electrode) 23 is connected to the ground by turning the second changeover switch 29 toward the B side, and the shower electrode 22 is connected to the first RF power source 21 by turning the first changeover switch 28 toward the B side. The deposition of silicon dioxide is carried out by introducing the reaction gas of silane through the gas inlet 27.

The silicon dioxide is formed on the wafer but is also deposited on the insulating cover 25 of SiC at the most amount in all the components except the substrate electrode.

Next, to carry out the chamber etching of the plasma processing apparatus, the first changeover switch 28 is turned toward the A side to ground the shower electrode 22, and the second changeover switch 29 is turned toward the A side to connect the susceptor (substrate side electrode) 23 to the second RF power source 26.

Then, $CF_4$ is flown through the gas inlet 27 into the chamber at 50 to 200 sccm and an RF bias of 13.56 kHz is applied to the susceptor 23 to carry out the chamber etching under a pressure in the range of 0.1–1 Torr. The etching rate is so high of the silicon dioxide on the insulating cover 25 of SiC, and the overall etching efficiency may be enhanced. Further, since $CF_4$ gas is used as the gas for the etching, the etching selectivity ratio of $SiO_2$ to SiC is high, so that the components made of SiC are not appreciably deteriorated. Therefore, the occurrence of particles can be substantially prevented during use of the apparatus after the chamber etching cleaning, by setting the degree of over-etching slightly excessive.

Incidentally, in the second embodiment of this invention, two power sources are used. However, it will be understood that the apparatus can be operated for the CVD processing and the chamber etching by use of a single power source. The single power source is selectively connected to one of the substrate electrode and the counter electrode.

In the second embodiment of this invention, the peripheral part of the shower electrode 22 (counter electrode) may also be made of SiC.

It will also be understood that the switching circuit of the power sources in FIG. 2 is applicable to the ECR type plasma processing apparatus.

The first and the second embodiments of the invention have been both described as using $CF_4$ gas for the etching. They are allowed to use other fluorocarbon type gases such as, for example, $C_2F_6$ gas and $C_3F_8$ gas, instead. They are not discriminated on account of the mode of operation.

It is also allowable to add a minute amount of $O_2$ gas to the etching gas for the purpose of precluding deposition of C.

When $H_2$ gas, for example, is incorporated into the $CF_4$ gas in an amount of not more than 50%, based on the amount of the $CF_4$ gas for the purpose of lowering the etching rate of SiC, the resultant mixture forms HF and consequently exalts the adsorption of $C_xF_y$ and improves the ratio of selectivity of the etching for the $SiO_2$ film and SiC.

In the present embodiments of this invention, such quantitative factors as the amount of gas to be introduced have been described by reference to specific numerical values. However, the embodiments do not restrict this invention.

As described above, the present invention permits the chamber etching time to be curtained by connecting the substrate electrode to the power source to convert it into a power source substrate electrode in preparation for the operation of chamber etching, thereby heightening the etching rate of the peripheral parts of the substrate electrode as compared with the conversion into a grounded substrate electrode.

The ratio of selectivity of the etching for the $SiO_2$ film to that for SiC can be exalted by limiting the film deposited during the CVD treatment to the $SiO_2$ film and, at the same time, limiting the gas used for the chamber etching to a fluorocarbon type gas. Thus, the peripheral parts of the substrate electrode are not easily deteriorated even when the chamber etching operation is repeated many times and the occurrence of extraneous matter is repressed.

The decrease of the frequency of the maintenance of apparatus and the decrease of the occurrence of particles both contribute to the augmentation of the yield.

What is claimed is:

1. A method of operating and chamber etching a plasma processing apparatus having a plasma chamber enclosing a substrate electrode that faces a counter electrode, the method comprising the steps of:

when operating the plasma processing apparatus to form a layer on a wafer carried by the substrate electrode, grounding the substrate electrode, connecting the counter electrode to a high frequency power source, and introducing a plasma-forming gas into the plasma chamber to thereby form a layer on the wafer; and when chamber etching the plasma processing apparatus after removal of the wafer, disconnecting the counter electrode from the high frequency power source and connecting it to ground, disconnecting the substrate electrode from ground and connecting it to the high frequency power source, and introducing a fluorocarbon gas into the plasma chamber to thereby etch deposits on an interior of the plasma chamber.

2. The method of claim 1, wherein the step of disconnecting and connecting the substrate electrode comprises the step of directly switching the substrate electrode from ground to the high frequency power source with a first switch.

3. The method of claim 2, wherein the step of disconnecting and connecting the counter electrode comprises the step of directly switching the counter electrode from the high frequency power source to ground with a second switch.

4. The method of claim 1, wherein the high frequency power source comprises two power sources, and wherein the step of connecting the counter electrode to the high frequency power source connects the counter electrode to a first of the two power sources, and wherein the step of connecting the substrate electrode to the high frequency power source connects the substrate electrode to a second of the two power sources.

5. A method of operating a plasma processing chamber to form a layer on a wafer by plasma CVD processing and to clean the chamber by chamber etching, the chamber having a substrate electrode with a surface portion for carrying the wafer during plasma CVD processing, a counter electrode facing the substrate electrode, a first power source for supplying a first high frequency electric energy, and a second power source for supplying a second high frequency electric energy, the method comprising the steps of:

grounding the substrate electrode during plasma CVD processing and connecting the first power source to the substrate electrode terminal during chamber etching with a first switch that is connected to the substrate electrode and selectively connected to ground and the first power source; and connecting the second power source to the counter electrode during plasma CVD processing, and grounding the counter electrode during chamber etching with a second switch that is connected to the counter electrode and selectively connected to ground and the second power source.

6. A method of operating a plasma processing chamber to form a layer on a wafer by plasma CVD processing and to clean the chamber by chamber etching, the chamber having a gas inlet for introducing a gas and a gas outlet for discharging exhausted gas, a substrate electrode in the chamber for carrying the wafer during plasma CVD processing, a counter electrode facing the substrate electrode with a predetermined gap therebetween, and a power source supplying a high frequency electric energy, the method comprising power source switching steps for connecting one of the substrate electrode and the counter electrode to the power source and grounding the other one of the substrate electrode and the counter electrode so that the power source supplies the high frequency electric energy to the counter electrode during plasma CVD processing and supplies the high frequency electric energy to the substrate electrode during chamber etching.

7. The method of claim 6, wherein said switching steps comprise the following steps:

grounding the substrate electrode during plasma CVD processing and connecting the power source to the substrate electrode terminal during chamber etching with a first switch that is connected to the substrate electrode and selectively connected to ground and the power source; and connecting the power source to the counter electrode during plasma CVD processing, and grounding the counter electrode during chamber etching with a second switch that is connected to the counter electrode and selectively connected to ground and the power source.

8. The method of claim 7, wherein the power source comprises two power sources, and wherein the step of connecting the counter electrode to the power source connects the counter electrode to a first of the two power sources, and wherein the step of connecting the substrate electrode to the power source connects the substrate electrode to a second of the two power sources.

* * * * *